(12) United States Patent
Yeongha et al.

(10) Patent No.: US 6,731,162 B2
(45) Date of Patent: May 4, 2004

(54) MULTI-CHANNEL DIGITAL AMPLIFIER FOR SHIFTING PHASES OF PWM SIGNALS

(76) Inventors: Choi Yeongha, #601, Byucksan Digital Valley, 212-16, Guro-dong, Guro-gu, Seoul 152-050 (KR); Park Kyoungsoo, #601, Byucksan Digital Valley, 212-16, Guro-dong, Guro-gu, Seoul 152-050 (KR); Sung Koeng-Mo, #601, Byucksan Digital Valley, 212-16, Guro-dong, Guro-gu, Seoul 152-050 (KR)

( * ) Notice: Subject to any disclaimer, the term of this patent is extended or adjusted under 35 U.S.C. 154(b) by 0 days.

(21) Appl. No.: 10/161,327

(22) Filed: Jun. 3, 2002

(65) Prior Publication Data

US 2003/0006838 A1 Jan. 9, 2003

(30) Foreign Application Priority Data

Jun. 5, 2001 (KR) ................... 10-2001-0031544

(51) Int. Cl.[7] ................................. H03F 3/38
(52) U.S. Cl. ..................... 330/10; 330/124 R
(58) Field of Search .............. 330/10, 124 R, 330/207 A, 251; 375/238

(56) References Cited

U.S. PATENT DOCUMENTS 5,218,315 A 6/1993 Turner ..................... 330/10
6,469,575 B1 * 10/2002 Oki et al. ................. 330/10

FOREIGN PATENT DOCUMENTS

KR 2000-0051381 12/2000

* cited by examiner

Primary Examiner—Steven J. Mottola
(74) Attorney, Agent, or Firm—Harness, Dickey & Pierce, P.L.C.

(57) ABSTRACT

Disclosed herewith is a multi-channel digital amplifier. The multi-channel digital amplifier includes a PWM converter, switching circuits, and low pass filters. The PWM converter converts an input signal to N low power PWM signals (N is two or more). The switching circuits amplifies the N low power PWM signals to generate N high power PWM signals. The low pass filters convert the N high power PWM signals to analog signals inputted to a plurality of speakers. The phases of the N low power PWM signals are made to be different from each other to make the on/off times of the semiconductor switching elements of the switching circuit to be different.

2 Claims, 6 Drawing Sheets

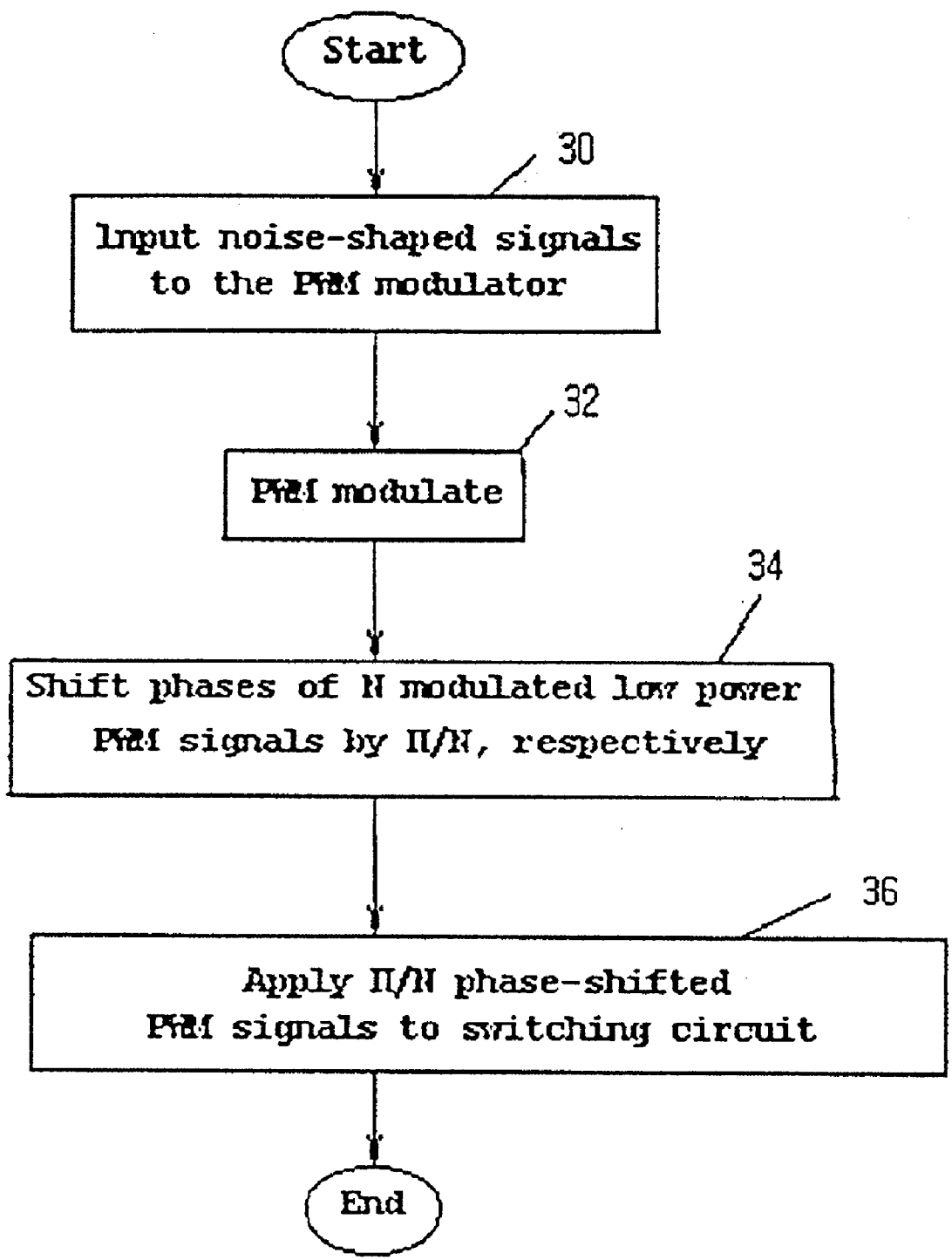

MULTI-CHANNEL DIGITAL AMPLIFIER FOR SHIFTING PHASES OF PWM SIGNALS

BACKGROUND OF THE INVENTION

1. Field of the Invention

The present invention relates generally to a multi-channel digital amplifier, and more particularly to a multi-channel digital amplifier for shifting the phases of PWM signals, wherein the phases of the PWM signals of multiple channels, which are applied to a plurality of switching elements such as the field effect transistors of the switching circuit of the digital amplifier, are shifted to be different from each other to make the on/off times of the switching elements to be different, thus minimizing cross talk between the switching elements.

2. Description of the Prior Art

In general, a digital amplifier is a device, which pulse width modulates a digital signal having small amplitude, such as a Pulse Code Modulation (PCM) signal, to a Pulse Width Modulation (PWM) signal, amplifies the PWM signal by using an amplifying circuit having a semiconductor switching element such as a Field Effect Transistor (FET), and outputs an analog audio signal demodulated by a Low-Pass Filter (LPF) to a speaker.

FIG. 1a is a block diagram of a general digital amplifier 10. A digital input signal PCM is modulated into a low power PWM signal, and then the PWM signal is inputted to a switching circuit 14 to which high power is applied by a power supply 16 to turn on/off the semiconductor switching element of the switching circuit 14, such as a FET. The switching circuit 14 amplifies the PWM signal from low power to high power. Finally, the high power PWM signal passes through a low pass filter 18 to be demodulated to an original analog signal. This analog signal causes speaker to generate sound. This digital amplifier 10 can be integrated into a single chip because all circuits except the low pass filter 18 are digital circuits. In addition, a manufacturer of the digital amplifier can easily add, delete or modify a specific function to, from or of the digital amplifier 10 using ASIC (Application Specific Integrated Circuit) technology that is developing rapidly nowadays.

FIG. 1b is a block diagram showing a PWM converter 12 of the general digital amplifier 10 in detail. The PWM converter 12 consists of an oversampler 22 (an N times oversampler), a noise shaper 24 and a PWM modulator 26. The oversampler 22 increases a sampling frequency to change the PCM digital signal to a PWM signal with no nonlinear distortion, the noise shaper 24 shifts the frequency of a noise component to a frequency higher than an audible frequency, and the PWM modulator 26 finally converts the signal to the PWM signal.

FIG. 1c is a graph showing a PCM signal that is a digital signal to be inputted to the general digital amplifier 10, a low power PWM signal that is formed by the PWM converter 12, and a high power PWM signal that is formed by the switching circuit 14.

FIG. 1d is a graph showing the propagation delay of a PWM signal before and after amplification. The semiconductor switching element FET constituting the switching circuit 14 is not turned on/off immediately the PWM signal with low power is inputted to this circuit from the PWM converter 12, but is turned on/off after a certain time elapses. Accordingly, as shown in FIG. 1d, the switching circuit 14 outputs the high power PWM signal that has been delayed by $t_{on}$ and $t_{off}$ with respect to the low power PWM signal.

However, the digital amplifier 10 may be used as a mono type using a single channel, but in most case it is used as a multi-channel type using two or more channels. Although an overall structure of this multi-channel digital amplifier is similar to the above mentioned digital amplifier 10, there are differences between the amplifiers in that the PWM converter 12 outputs a plurality of PWM signals corresponding to the number of channels N, and the PWM signals respectively generates N high power PWM signals by N switching elements 14a, 14b, ..., 14n, as shown in FIG. 2a. FIG. 2b shows the low power multi-channel PWM signals to be inputted to the N switching elements 14a, 14b, ..., 14n from the PWM converter 12. However, in this conventional multi-channel digital amplifier, when the switching element 14b outputting a PWM signal of a channel No. 2 in FIG. 1b is turned on or off just before the switching element 14a outputting a PWM signal of a channel No. 1 is turned on, the delay time of the switching element 14a of the channel No. 1 is increased or decreased abnormally to distort the high power PWM signal of the switching element 14a of the channel No. 1. This phenomenon is referred to as "cross talk".

In the case of a multi-channel digital amplifier that should amplify a pulse signal having a high frequency, cross talk further increases the distortion of an outputted waveform, and exerts a bad electromagnetic influence on other adjacent circuits constituting the digital amplifier 10.

SUMMARY OF THE INVENTION

Accordingly, the present invention has been made keeping in mind the above problems occurring in the prior art, and an object of the present invention is to provide a multi-channel digital amplifier, wherein the on/off times of the semiconductor switching elements of a switching circuit are made to be different from each other by shifting the phases of the low power PWM signals of each channel, thereby minimizing cross talk.

In order to accomplish the above object, the present invention provides a multi-channel digital amplifier, comprising a PWM converter for converting an input signal to N low power PWM signals (N is two or more); switching circuits for amplifying the N low power PWM signals to generate N high power PWM signals; and low pass filters converting the N high power PWM signals to analog signals inputted to a plurality of speakers; wherein the phases of the N low power PWM signals are made to be different from each other to make the on/off times of the semiconductor switching elements of the switching circuit to be different.

Preferably, the PWM converter shifts the phases of the PWM signals to make the phases of the PWM signals to be different.

In accordance with another feature of the present invention, there provided a method of manufacturing a multi-channel digital amplifier, comprising the steps of designing a digital amplification chip using Hardware Description Language, approving a design through a software or hardware method, and fabricating the multi-channel digital amplifier using the approved design.

BRIEF DESCRIPTION OF THE DRAWINGS

The above and other objects, features and other advantages of the present invention will be more clearly understood from the following detailed description taken in conjunction with the accompanying drawings, in which:

FIG. 4 is a flowchart showing a process of shifting the phases of the low power PWM signals in accordance with the embodiment of the present invention.

DESCRIPTION OF THE PREFERRED EMBODIMENTS

Now, an embodiment of the present invention will be described with reference to the accompanying drawings, but the present invention is not limited to this embodiment.

Figure 1A:
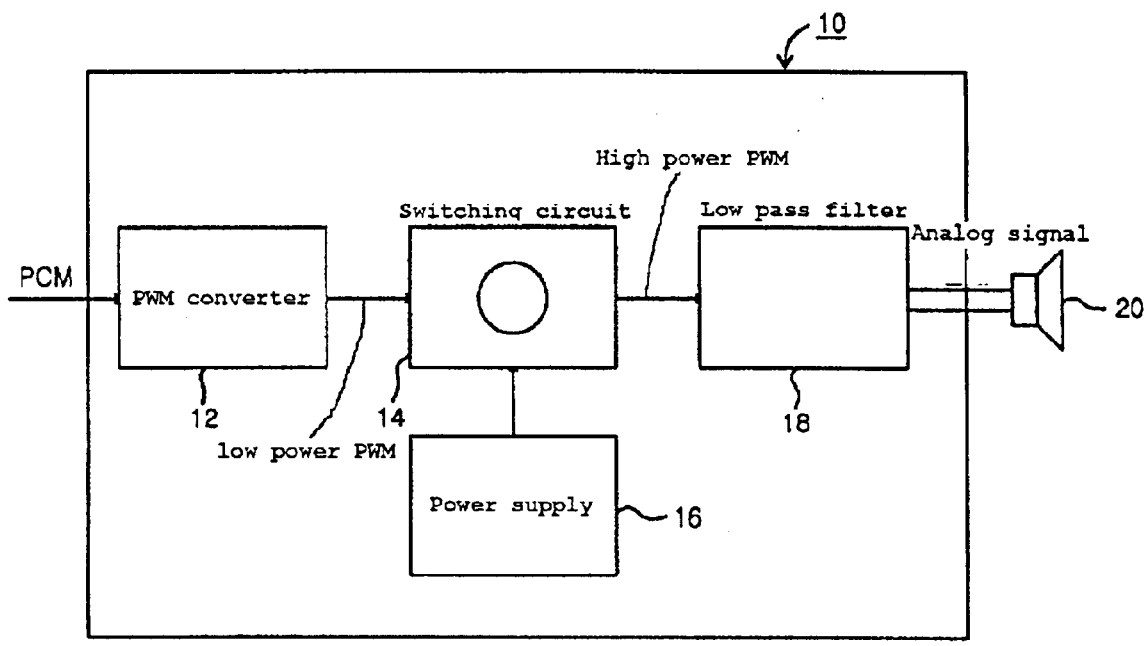
FIG. 1a is a block diagram of the general digital amplifier.
Figure 1B:
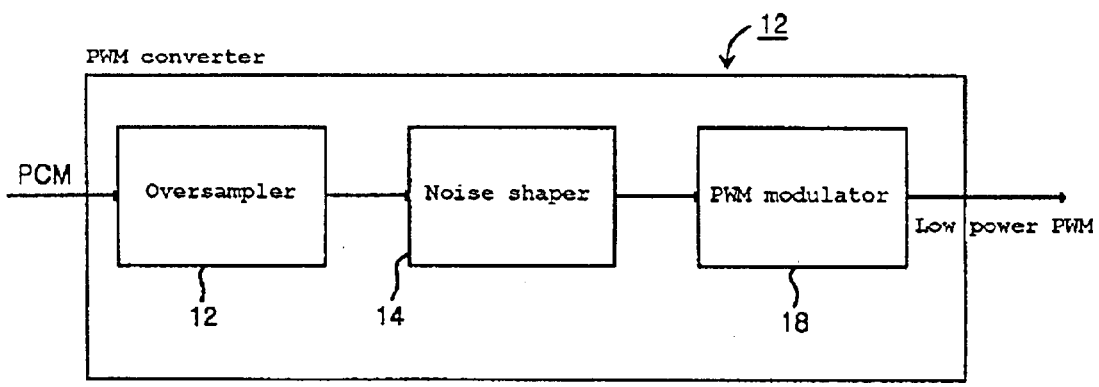
FIG. 1b is a block diagram showing a PWM converter of FIG. 1a in detail.
Figure 1C:
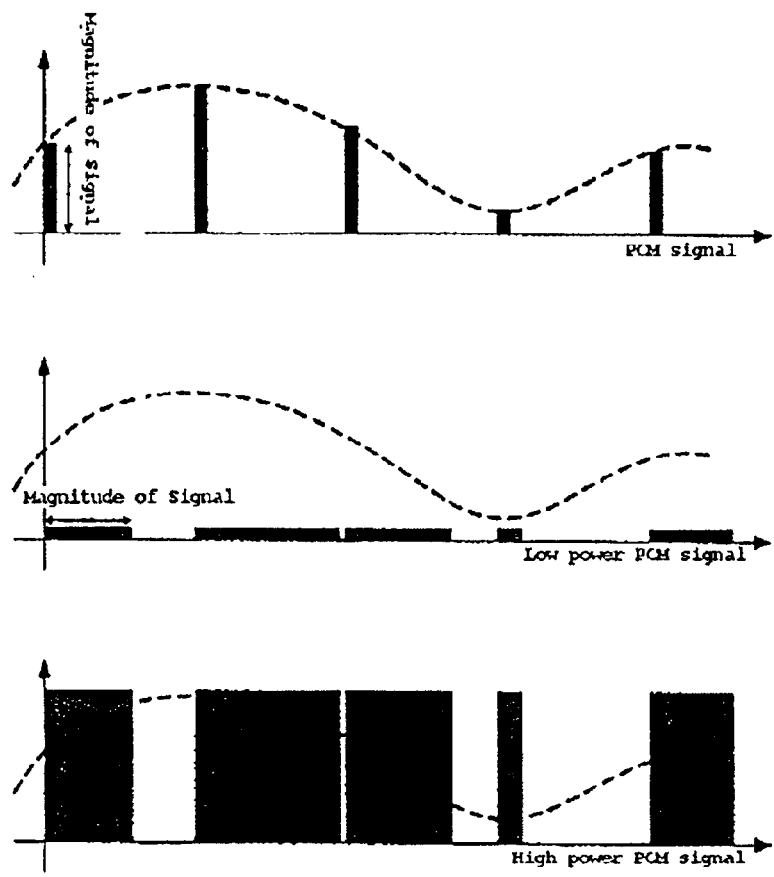
FIG. 1c is a graph showing a PCM signal of the digital amplifier 10 in FIG. 1a, a low power PWM signal before and after amplification.
Figure 1D:
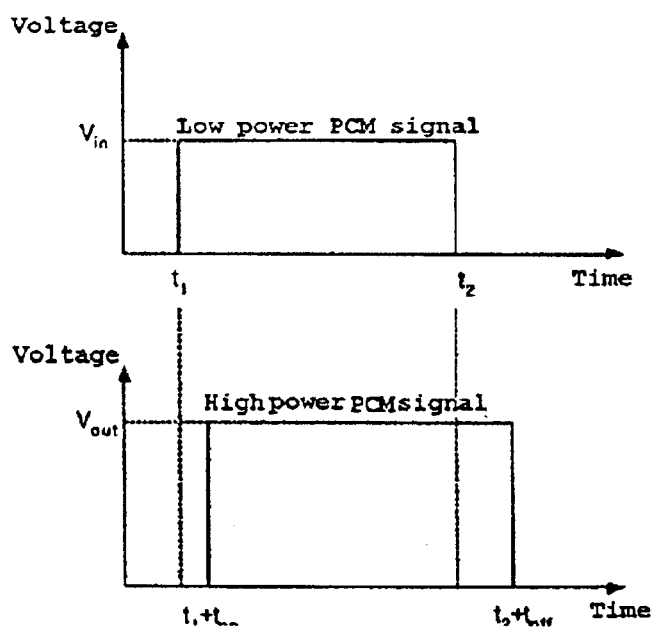
FIG. 1d is a graph showing the propagation delay of a PWM signal before and after amplification.
Figure 2A:
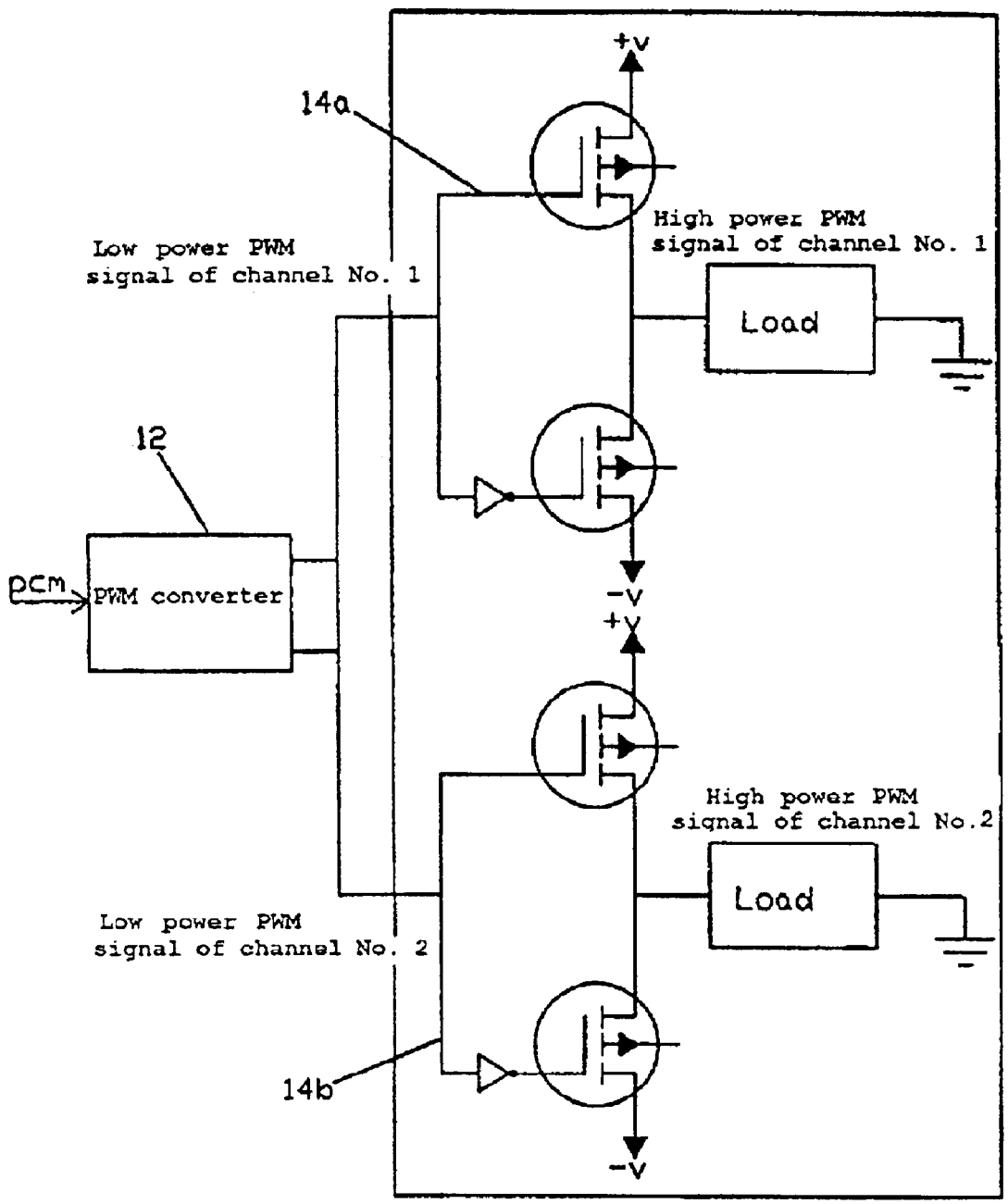
FIG. 2a is a diagram showing the construction of a high power switching circuit of the multi-channel digital amplifier.
Figure 2B:
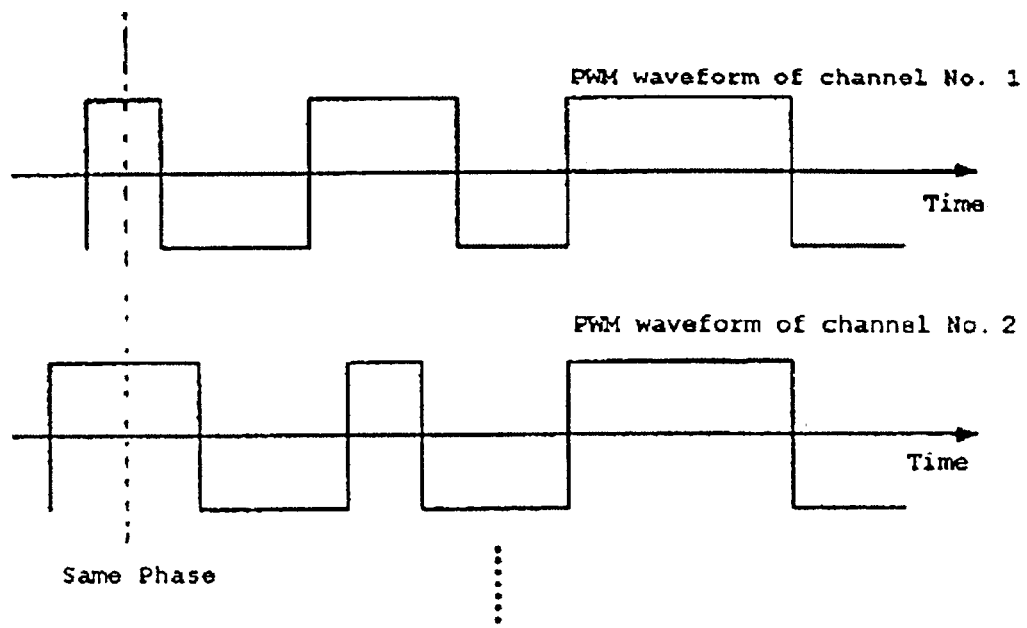
FIG. 2b is a diagram showing the input waveforms of low power PWM signals of the multi-channel digital amplifier.

A multi-channel digital amplifier according to the present invention has the same general construction as the conventional multi-channel digital amplifier that has been described with reference to FIGS. 1 and 2, so a description of the general structure of the multi-channel digital amplifier of the present invention is omitted. Additionally, the names and reference numerals of the elements of the conventional multi-channel digital amplifier are identically used in the description of the embodiment of the present invention.

In the conventional multi-channel digital amplifier 10 described with reference to FIGS. 1 and 2, the phases of the low power PWM signals, which are outputted from the PWM modulator 26 of the PWM converter 12 and inputted to each of the semiconductor switching elements 14a, 14b, ..., 14n of the switching circuit 14, are all the same.

Figure 3:
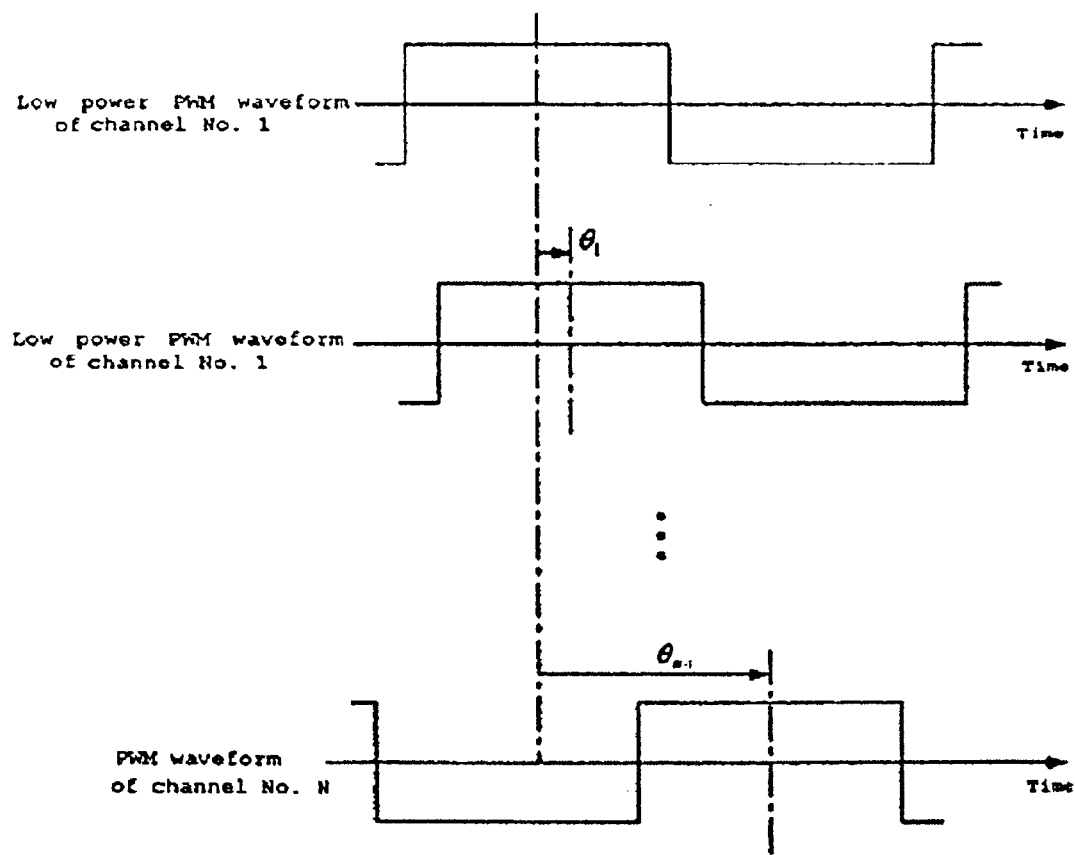
FIG. 3 is a diagram showing the input waveforms of the low power PWM signals of a multi-channel whose phases are shifted in accordance with an embodiment of the present invention.

As seen in FIG. 3, in the multi-channel digital amplifier of the present invention, the phases of the low power PWM signals of channels are different from each other. When the number of the channels is N (N is two or more), the phases of the low power PWM signals have a difference of Π/N. For example, in the case of two channels, the phases of the two PWM signals have a difference of Π/2 (90°), and in the case of three channels, the phases of the three PWM signals have a difference of Π/3 (60°). It is preferred that the phases of the low power PWM signals differ by Π/n, but the spirit of the present invention is to make the phases of the low power PWM signals to be difference regardless of the amount of the difference. It is more preferable for a high frequency wave that the phase difference is larger. For a low frequency wave, the effect of the present invention can also be achieved even with a small phase difference.

The phase difference of the low power PWM signals of these channels can be generated by adding a functional block that transfers the phases of the low power PWM signals by the PWM modulator 26 of the PWM converter 12 when the multi-channel digital amplifier is made using ASIC integrated technology. As well known to an ASIC manufacturer of general digital amplifiers, when the PWM modulator 26 of the PWM converter 12 is designed as a digital amplification chip using Hardware Description Language (HDL), such as Very High speed integrated circuit Hardware Description Language (VHDL), the phase difference can be easily generated by adding a functional block to shift the phases of the modulated low power PWM signals. If waveforms of the channels, which are outputted from the PWM modulator having the added functional block using a standard logic simulator, such as Verilog X-L or Leapfrog of the Cadence company, have different phases as shown in FIG. 3 after the functional block is added to the multi-channel digital amplifier chip, the design of the digital amplification chip is approved, otherwise the digital amplification chip is modified. For an ASIC approval method for design, there is a hardware type approval method using a FPGA (Field Programmable Gate Array), as well as a software type approval method. In the hardware type approval method using the FPGA, the designed ASIC is modularized into a plurality of blocks according to their functions to approve in an actual environment the function of the overall ASIC by applying each of the blocks to the FPGA.

Additionally, for a comparison of the effects of the conventional multi-channel digital amplifier and the multi-channel digital amplifier of the present invention, the waveforms of the high power PWM signals that are outputted through the switching circuit 14 were compared using an oscilloscope.

FIG. 4 is a flow chart showing the phase shift of the PWM signal performed by the functional block that transfers the phases of the low power PWM signals modulated by the PWM modulator 26 of the PWM converter 12 according to the embodiment of the present invention.

That is, the digital signals of each channel, which are noise-shaped by the noise shaper 24 of the PWM converter 12 and inputted to the PWM modulator 16 at step S30, are modulated to the PWM signals at step S32. The phases of the N PWM signals, which have been modulated, are shifted by H/N at step S34. The phase-shifted PWM signals are applied to each of the switching elements 14a, 14b, ..., 14n of the switching circuit 14 at step S36. The PWM signals with different phases are able to minimize the occurrence of cross talk between the switching elements 14a, 14b, ..., 14n.

Similarly to the conventional multi-channel digital amplifier, the high power PWM signals of the N channels amplified by the switching circuit 14 are finally demodulated to analog signals by the low pass filter 18.

Hereinbefore, although the multi-channel digital amplifier of one embodiment of the present invention has been described, the present invention is not limited to the embodiment, and includes any modifications by those skilled in the art without departing from the spirit of the invention.

Although the multi-channel digital amplifier of the present invention is made as a single chip using ASIC technology, it may be manufactured using normal electronic circuits.

Additionally, in the embodiment, the PWM modulator caused the phase differences of the PWM signals by shifting the phases of the PWM signals, but a separate phase shifter may be included.

Additionally, although the phases of the PWM signals are shifted according to the embodiment so as to make the phases of the PWM signals to be different, the scope of the present invention includes a multi-channel digital amplifier having the conventional apparatuses that make the phases of the PWM signals to be different.

COMPARATIVE EXAMPLE

Now, a comparison of the effects of the conventional multi-channel digital amplifier and the multi-channel digital amplifier of the present invention is described. For the comparison, a "THD (Total Harmonic Distortion)+N" was measured.

The THD, which is an index of the estimation of linear characteristics of output signals, is defined as the percentage of the root-mean-square value (rms) of fundamental frequency components to the rms of high frequency components, which is obtained by subtracting fundamental frequency components from all the components of the output signals. The smaller the THD, the better the audio performance of the digital amplifier. Meanwhile, N designates noise. Accordingly, "THD+N" is the arithmetic sum of the THD and the noise N, and these two indices cannot be measured separately but can be measured together.

In order to measure the "THD+N", a noise shaper and a PWM modulator were implemented using FPGAs. An oversampling-only chip was employed as the oversampler, while a half bridge circuit was employed as the switching circuit. After the two multi-channel digital amplifiers were implemented in such a way, only their phases were made to be different using the ROM data of the FPGAs with all the other conditions maintained the same, thus implementing the conventional multi-channel amplifier and the multi-channel amplifier of the present invention in actual conditions.

Meanwhile, in order to measure the "THD+N" of the two multi-channel digital amplifier, a measuring apparatus, which is named SYS-2322 and can support digital output and analog input, was selected among measuring instruments that were exclusively used for audio and manufactured by "Audio Precision" company of America. Measurement was performed using the measuring instrument in a "THD+N" measuring mode. An output signal was a digital signal outputted from the measuring instrument, while an input signal was a voltage between two ends of an 8 Ω resistor with no inductance that was connected to the digital amplifier. The input signal was measured while being applied to an analog input port of the measuring instrument.

Figure 5A:
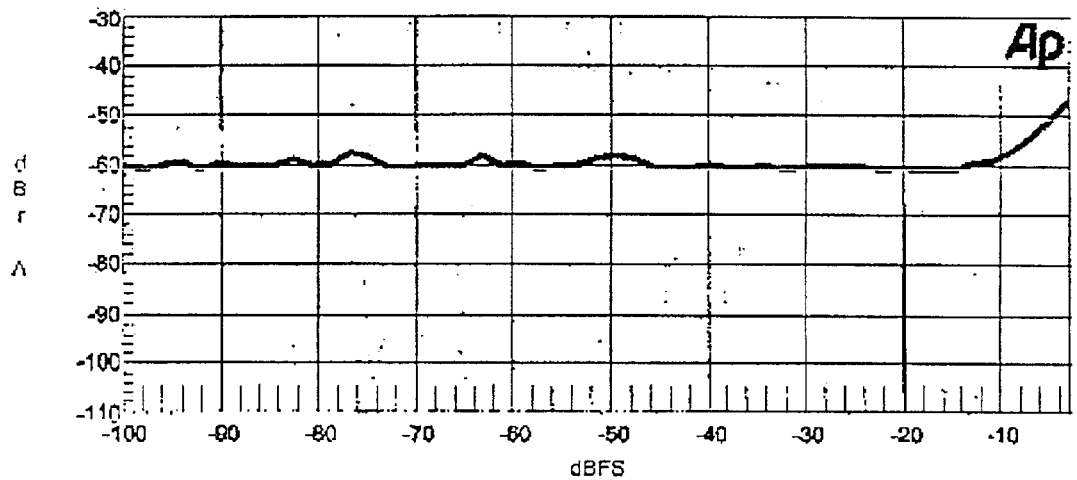
FIGS. 5a and 5b are graphs showing "THE+N" of the conventional multi-channel digital amplifier and "THE+N" of the multi-channel digital amplifier of the present invention, respectively.
Figure 5B:
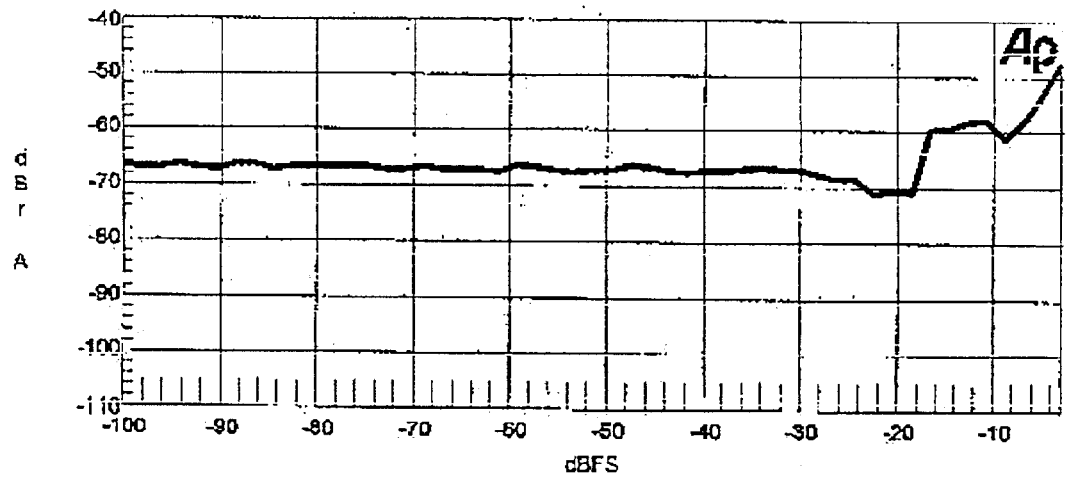

FIGS. 5a and 5b are graphs showing the THD+N of the conventional multi-channel digital amplifier and the THD+N of the multi-channel digital amplifier of the present invention measured in the above way. In the graphs of FIGS. 5a and 5b, the X-axis shows the magnitudes of inputted signals, while the Y-axis shows "THD+N".

As seen in FIGS. 5a and 5b, the "THD+N" of the multi-channel digital amplifier of the present invention whose phases are shifted is decreased by 7 dB in comparison with that of the conventional multi-channel digital amplifier, resulting in improving the efficiency of the digital amplifier of the present invention that much.

As mentioned above, the multi-channel digital amplifier of the present invention makes the on/off times of the semiconductor switching elements of the switching circuit to be different by shifting the phases of the low power PWM signals of channels, thus minimizing cross talk to remarkably decrease noise and improve the efficiency of the digital amplifier.

The disclosure of Korean patent application No. 2001-31544 filed Jun. 5, 2001 is hereby incorporated by reference.

What is claimed is:

1. A multi-channel digital amplifier, comprising:
    a PWM converter for converting an input signal to N low cower PWM signals (N is two or more);
    switching circuits for amplifying the N low power PWM signals to generate N high power PWM signals:
    low pass filters converting the N high power PWM signals to analog signals inputted to a plurality of speakers;
    wherein the phases of the N low power PWM signals are made to be different from each other to make the on/off times of the semiconductor switching elements of the switching circuit to be different; and
    wherein the phases of the low power N PWM signals differ from each other by $\Pi/N$.

2. A multi-channel digital amplifier, comprising:
    a PWM converter for converting an input signal to N low power PWM signals (N is two or more);
    switching circuits for amplifying the N low power PWM signals to generate N high power PWM signals;
    low pass filters converting the N high power PWM signals to analog signals inputted to a plurality of speakers;
    wherein the phases of the N low cower PWM signals are made to be different from each other to make the on/off times of the semiconductor switching elements of the switching circuit to be different;
    wherein the PWM converter shifts the phases of the PWM signals to make the phases of the PWM signals to be different; and
    wherein the phases of the low power N PWM signals differ from each other by $\Pi/N$.

* * * * *